United States Patent [19]

Pilz

[11] 4,369,330
[45] Jan. 18, 1983

[54] HOUSING FOR ELECTRICAL COMPONENTS, COMPONENT GROUPS OR INTEGRATED CIRCUIT

[76] Inventor: Dieter Pilz, Zugspitzstrasse 6, D-8039 Puchheim, Fed. Rep. of Germany

[21] Appl. No.: 244,902

[22] Filed: Mar. 18, 1981

[30] Foreign Application Priority Data

Mar. 26, 1980 [DE] Fed. Rep. of Germany ....... 3011730

[51] Int. Cl.³ .............................................. H05K 5/06
[52] U.S. Cl. ................................ 174/52 FP; 357/74; 174/52 S
[58] Field of Search ............ 174/52 S, 52 FP, 52 PE; 357/74; 264/272.17, 272.18; 336/90; 338/273, 274, 276

[56] References Cited

U.S. PATENT DOCUMENTS

| 3,501,582 | 3/1970 | Heidler et al. | 174/52 PE |
| 3,737,729 | 6/1973 | Carney | 174/52 FP |
| 3,806,766 | 4/1974 | Fanning | 174/52 PE |
| 3,838,316 | 9/1974 | Brown et al. | 174/52 PE |
| 4,139,726 | 2/1979 | Penrod et al. | 174/52 FP |
| 4,246,437 | 1/1981 | Frey et al. | 174/52 PE |
| 4,272,644 | 6/1981 | Visser et al. | 174/52 FP |

FOREIGN PATENT DOCUMENTS

2609884 9/1976 Fed. Rep. of Germany .
2610172 9/1976 Fed. Rep. of Germany .

OTHER PUBLICATIONS

Book by Siemens "Components, Technical Explanations and Characteristic Data for Students, Sec. Ed., p. 186.
Journal "Siemens Components" 18 (1980), No. 1, pp. 44 and 45.

*Primary Examiner*—A. T. Grimley
*Assistant Examiner*—D. A. Tone
*Attorney, Agent, or Firm*—Herbert L. Lerner; Laurence A. Greenberg

[57] ABSTRACT

Housing for electrical components, component groups or integrated circuits, including a rectangular dish part with oppositely disposed side walls having recesses and a set-back portion formed therein, a cover part being inserted in the dish part and having an outwardly protruding rib disposed thereon forming a circular channel with the set-back portion, connecting parts having a right angle bend and being disposed in and fitted to the recesses for mechanically and electrically connecting an electrical component to a printed circuit outside the housing, and synthetic casting resin filling the channel for hermetically sealing the connecting parts to the dish and cover parts or the cover part has the recesses formed therein.

2 Claims, 6 Drawing Figures

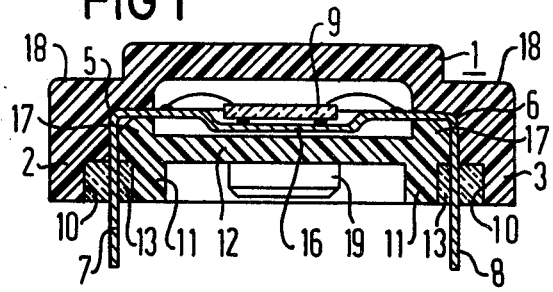
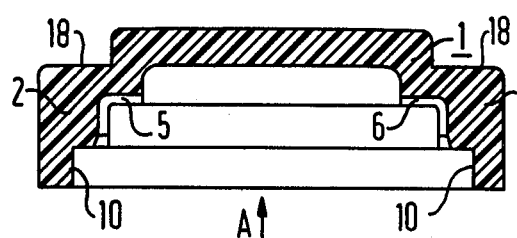
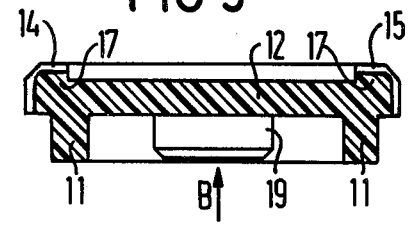
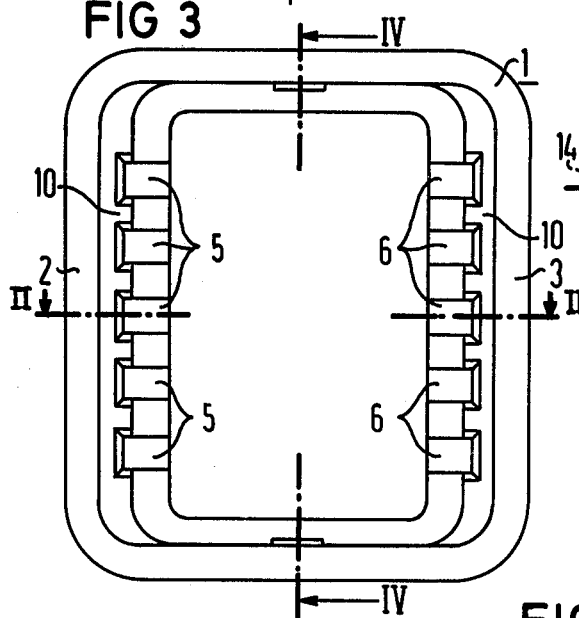
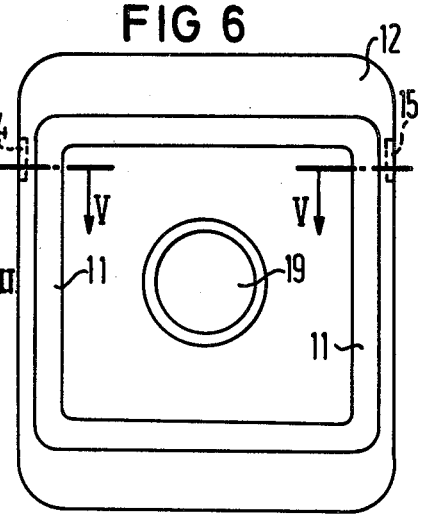
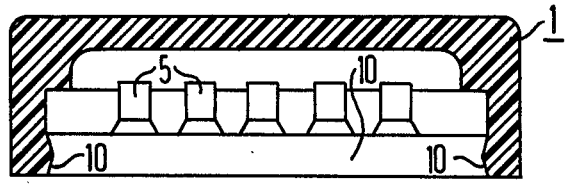

HOUSING FOR ELECTRICAL COMPONENTS, COMPONENT GROUPS OR INTEGRATED CIRCUIT

The invention relates to a housing for electrical components, component groups or integrated circuits, especially for an electric surface wave filter, that have connecting means which are brought through the housing to the outside, for mechanical and electrical connection to a printed circuit, including a rectangular dish part and a cover part fitted thereto and hermetically sealed by means of a synthetic resin casting.

The housing according to the present invention is suitable for passive and active electrical components (resistors, capacitors, inductances, relays, diodes, transistors), groups of components (passive and/or active electrical components assembled on a board and wired to each other), and for integrated circuits. Particularly advantageous is the use of the housing for electric surface wave filters which include a piezoelectric body with metallic electrodes applied thereon exciting the surface waves (input transducer), passing them on (coupler) and taking them off (output transducer).

Integrated circuits, such as operational amplifiers, are described in the book by the firm Siemens: "Bauelemente, technische Erläuterungen and Kenndaten für Studierende" (Components, Technical Explanations and Characteristic Data for Students), second edition, 1977, page 186.

Surface wave filters of the above-mentioned kind are described in the journal "Siemens Components" 18 (1980), No. 1, Pages 44 and 45 but only with respect to the operation and not with respect to the mechanical detail of the construction of the housing.

It is a common feature of all these electrical components, component groups or integrated circuits that they are applied to a substrate which, as a rule, includes a sheet of metal and already has the external connecting parts which are brought through the housing to the outside and serve for the mechanical and electrical connection to a printed circuit. For instance, if this substrate is made as a stamping, it is a so-called "support spider". In the assembly, the external connection parts are either left in a plane with the support or are in particular, bent off at a right angle.

Integrated circuits and semiconductor components of this type are usually provided with an encapsulation, customarily in injection molds. However, it happens that the electrical component or the integrated circuit must frequently be accommodated in a cavity of the housing which in some cases is even filled with an inert gas.

In German Published Non-Prosecuted Application DE-OS No. 26 09 884, a wave filter with an elastic wave propagation surface with a piezoelectric substrate is described. On one side of the filter are disposed transducer electrodes which include comb-like interleaving parts, one of which can be connected to an electric input signal source, and the other to an external load. The transducer electrodes are disposed at a physical spacing but piezoelectrically coupled through the substrate, and each transducer electrode has two interleaved comb-like electrode arrangements. This known filter is accommodated in a housing which is formed of a dish part and a cover part. The connecting parts for the external termination are either firmly attached in the cover part or brought around the cover part, while the dish part is placed over the electrode arrangements and the cover part represents the piezoelectrically active element. The dish part, there called a protective cap, is connected with its edge surface to the edge part of the surface carrying the electrodes of the piezoelectric substrate 10, such as by cementing.

Assembling this known wave filter is expensive and hard to automate, so that production of large quantities is by no means assured. To this is added the fact that the connection between the protective cap and the piezoelectric substrate is not free of passages for atmospheric influences (moisture, exhaust gases, etc.).

In German Published Prosecuted Application DE-AS No. 26 10 172, a filter of the acoustic surface wave type is described in which a housing with a rectangular bottom wall, a rectangular cover wall and two pairs of opposite side walls are provided for the piezoelectric substrate containing the input and output transducers. In that device the piezoelectric substrate extends in the interior of the housing substantially parallel to the cover wall and to the bottom wall. With respect to the structural construction of the mounting for the substrate, it is assumed that all useful electro-acoustic processes having an undisturbed operation which must be taken into consideration, take place on the substrate within the transducers and on the surface, serving as the sound transmission path, between the transducers. For this purpose it is proposed that in the interior of the housing, two supports of synthetic or natural rubber, preferably of silicone rubber, are associated with the substrate, one support of which is arranged at the substrate between the input transducer and the end face of the substrate adjacent to this transducer, while the second support is located between the output transducer and the end face of the substrate adjacent to this transducer. The contact pins leading to the outside are firmly arranged in the bottom wall (cover part). The cover part together with the piezoelectric arrangement is inserted into the dish part in such a manner that a space remains. After the filter is mounted in this manner, a considerably layer of synthetic resin is applied to the outside of the cover part in order to seal the interior hermetically. Before the synthetic resin layer is applied, an inert gas may be introduced into the interior of the housing.

In all electrical components built into a housing preferably formed of plastic, the difficulty arises that the hermetic seal can be made so as to be inadequate and not durable for long periods of time. The synthetic resin layer used in the last-described known filter shrinks and develops cracks, and this may already happen a short time after the manufacture. To this is added the fact that the assembly of the housing cannot be automated or can only be automated with difficulty.

It is accordingly an object of the present invention to provide a housing for electrical components, component groups or integrated circuits, which overcomes the hereinafore-mentioned disadvantages of the heretofore-known devices of this general type, and which ensures the possibility of automated assembly in that the component, the component group or the integrated circuit to be employed is secured in its location by certain arrangements and that provision is made that a certain amount of sealing already takes place without synthetic resin casting which, in the further course of the manufacture, prevents penetration of the synthetic resin into the cavity during the liquid phase of the resin.

With the foregoing and other objects in view there is provided, in accordance with the invention, a housing for electrical components, component groups or integrated circuits, particularly for an electric surface wave filter, comprising a rectangular dish part with oppositely disposed side walls having recesses and a set-back portion formed therein, a cover part being inserted in the dish part and having an outwardly protruding rib disposed thereon forming a circular channel with the set-back portion, connecting parts having a right angle bend and being disposed in and fitted to the recesses for mechanically and electrically connecting an electrical component to a printed circuit outside the housing, and synthetic casting resin filling the channel for hermetically sealing the connecting parts to the dish and cover parts.

In accordance with an alternate concomitant feature of the invention, there is provided a housing for electrical components, component groups or integrated circuits, particularly for an electric surface wave filter, comprising a rectangular dish part having a set-back portion formed therein, a cover part being inserted in the dish part and having an outwardly protruding rib and sides having recesses formed therein, the rib and set-back forming a circular channel, connecting parts having a right angle band and being disposed in and fitted to the recesses for mechanically and electrically connecting an electrical component to a printed circuit outside the housing, and synthetic casting resin filling the channel for hermetically sealing the connecting parts to the dish and cover parts.

The first type of solution is to be preferred because through the arrangement of cutouts or recesses in the side walls of the dish part, very accurate centering during the manufacture is possible. If, in a reversal of this construction, the cutouts are applied to the cover part, a fixed position of the electrical components is also possible but it may be necessary in that case during the automatic manufacturing process, to turn the component 180° in a vertical plane, so that the casting of synthetic resin can be applied.

Other features which are considered as characteristic for the invention are set forth in the appended claims.

Although the invention is illustrated and described herein as embodied in a housing for electrical components, component or integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is a diagrammatic cross-sectional view of a housing with a surface wave filter inserted in the assembled condition;

FIG. 2 is a view similar to FIG. 1 of the dish part thereof taken along the line II—II in FIG. 3, in the direction of the arrows;

FIG. 3 is a top plan view of the dish part as seen in the direction of the arrow A in FIG. 2;

FIG. 4 is a cross-sectional view of the dish part taken along the line IV—IV in FIG. 3, in the direction of the arrows;

FIG. 5 is a cross-sectional view of the cover part taken along the line V—V in FIG. 6, in the direction of the arrows; and FIG. 6 is a top plan view of the cover part as seen in the direction of the arrow B in FIG. 5.

Referring now to the figures of the drawing in which the same reference symbols are used for like parts, and first particularly to FIG. 1 thereof, there is shown the assembled housing with an electrical component contained therein, in this case a surface wave filter. The dish part 1 has walls 2, 3 and a cover part and surrounds the component 9 which is mounted on a support 16. The support 16 merges into or is integral with the connecting parts 7 and 8 which are bent-off at a right angle. These connecting parts 7 and 8 are inserted into recesses 5 and 6 formed in the walls 2, 3 of the dish part 1; the recesses are formed so as to be fitted to the connecting parts and are shown in detail in FIGS. 2 to 4. A cover part 12 closes off the housing and holds the connecting parts 7 and 8 in the recesses 5 and 6 of the cover of the dish part 1. The dish part 1 has portions 10 which are offset in their edge region, and which together with bridges 11 disposed at the cover part form a channel 13 that is filled with casting resin.

In this manner, a sufficiently tight seal of the interior in the housing is already assured. This seal holds during the casting of the liquid synthetic resin and during the subsequent soldering, because the seal is already very well developed due to the fit of the recesses 5 and 6 to the connecting parts 7 and 8 and the fitted cover part 12. The casting-resin seal contained in the channel 13 need only contain a small amount of resin, so that shrinkage hardly occurs and in any case cracks and leaks are not observed.

The cover part 12 constructed according to FIG. 5 is pushed into the dish part 1 after the component is inserted, as can be seen from the adjacent FIG. 2 and 5 as well as FIGS. 3 and 6.

The cover part 12 has raised portions 17 which hold the connecting parts 7, 8 and also contribute to the hollow space in the housing. Set-backs 18 contribute an assurance that the material thickness of the cover of the dish part 1 is uniform throughout as far as possible in order to keep shrinkage uniform during the fabrication process. A centering knob 19 serves for gripping and/or centering the cover part 12 during the automated assembly.

Dotted lines in FIGS. 5 and 6 indicate that recesses 14 and 15 for receiving the connecting parts 7 and 8, may also be formed in the raised portions 17 in the cover part 12. In that case, no recesses are provided in the dish part.

The housing includes the two hereinafore-described plastic parts, namely the dish part 1 and the cover part 12. These two parts are brought around the carrier spider which includes the support 16 and the connecting part 7 and 8 disposed thereon. The electrical component 9 can be automatically attached on the stretched carrier spider; the connecting parts 7 and 8 are only bent downward at a right angle afterwards. After the two parts of the housing are put together around the bent carrier spider supporting the component 9, a revolving or circular channel is produced by the offset part 10 in the dish part 1 and the rib or bridge 11 of the cover 12; connecting parts 7,8 emerge from the center of the channel. Through appropriate construction of the dish part 1 or the cover part 12, a certain amount of sealing of the housing interior is already obtained after the parts are put together; this prevents casting resin from entering. This resin is introduced into the channel 13 in the form of one or more drops, runs along the channel, also surrounds the connecting parts 7 and 8 and, after setting, seals the housing in a largely airtight manner. To make the resin run better and to make it set faster, the housing is preferably warmed up prior to the casting and is held at that temperature until the resin has set.

The present invention achieves the formation of a housing of plastic which can be made fully automatically and can also be provided with the electrical component fully automatically. Cementing or thermoplastic welding is eliminated so that the detrimental thermal and mechanical stresses on the electrical component occurring in the process during the welding operation are not possible.

There is claimed:

1. A housing for electrical components, component groups or integrated circuits, comprising a rectangular dish part with oppositely disposed side walls having recesses and a set-back portion formed therein, a cover part being inserted in said dish part and having an outwardly protruding rib disposed thereon forming a circular channel with said set-back portion, connecting parts having a right angle bend and being disposed in and fitted to said recesses for mechanically and electrically connecting an electrical component to a printed circuit outside the housing, and synthetic casting resin filling said channel for hermetically sealing said connecting parts to said dish and cover parts.

2. A housing for electrical components, component groups or integrated circuits, comprising a rectangular dish part having a set-back portion formed therein, a cover part being inserted in said dish part and having an outwardly protruding rib and sides having recesses formed therein, said rib and set-back forming a circular channel, connecting parts having a right angle bend and being disposed in and fitted to said recesses for mechanically and electrically connecting an electrical component to a printed circuit outside the housing, and synthetic casting resin filling said channel for hermetically sealing said connecting parts to said dish and cover parts.

* * * * *